United States Patent [19]

Ueno et al.

[11] Patent Number: 5,661,431
[45] Date of Patent: Aug. 26, 1997

[54] OUTPUT CIRCUIT IN DARLINGTON CONFIGURATION

[75] Inventors: Masaji Ueno, Sagamihara; Yasukazu Noine, Chigasaki, both of Japan

[73] Assignee: Kabushiki Kaisha Toshiba, Kawasaki, Japan

[21] Appl. No.: 623,009

[22] Filed: Mar. 28, 1996

[30] Foreign Application Priority Data

Mar. 28, 1995 [JP] Japan ................... 7-069400

[51] Int. Cl.$^6$ ................................ H03K 17/615
[52] U.S. Cl. .................. 327/483; 327/575; 327/432
[58] Field of Search ........................... 327/407, 408, 327/409, 410, 411, 412, 413, 478, 479, 483, 574, 575, 576, 577, 578, 427, 432

[56] References Cited

U.S. PATENT DOCUMENTS

5,075,566 12/1991 Chuang et al. ................. 327/411
5,489,861 2/1996 Seymour ......................... 327/483

Primary Examiner—Timothy P. Callahan
Assistant Examiner—Sanh N. Nguyen
Attorney, Agent, or Firm—Oblon, Spivak, McClelland, Maier & Neustadt, P.C.

[57] ABSTRACT

An output circuit has a bipolar transistor circuit of a 1st and a 2nd bipolar transistor connected in Darlington configuration. The base of the 1st transistor is supplied with an input signal. The collector of the 2nd transistor is connected to a power supply through a 1st diode. And, a signal is outputted from the emitter of the 2nd transistor. The output circuit also includes a 1st PMOS transistor. The source of the 1st PMOS transistor is connected to the base of the 2nd transistor, its drain being grounded, and its the backgate being connected to the power supply through the 1st diode. The output circuit may further includes a 2nd PMOS transistor having a source and a backgate both connected to the power supply, a drain connected to the base of the 2nd transistor through a second diode, and a gate supplied with an inverting signal of the input signal. The output circuit may further includes: a 2nd PMOS transistor connected between the drain of the 1st PMOS transistor and ground, having a source and a backgate both being grounded, a drain connected to the drain of the 1st PMOS transistor, and a gate supplied with the input signal; and a 3rd bipolar transistor having a base connected to the drain of the 1st PMOS transistor, a collector connected to the base of the 2nd transistor, and an emitter being grounded.

5 Claims, 8 Drawing Sheets

OUTPUT CIRCUIT IN DARLINGTON CONFIGURATION

DETAILED DESCRIPTION OF THE INVENTION

The present invention relates to an output circuit, in particular to an output circuit wherein a guaranteed withstand voltage level is improved.

Figure 6:
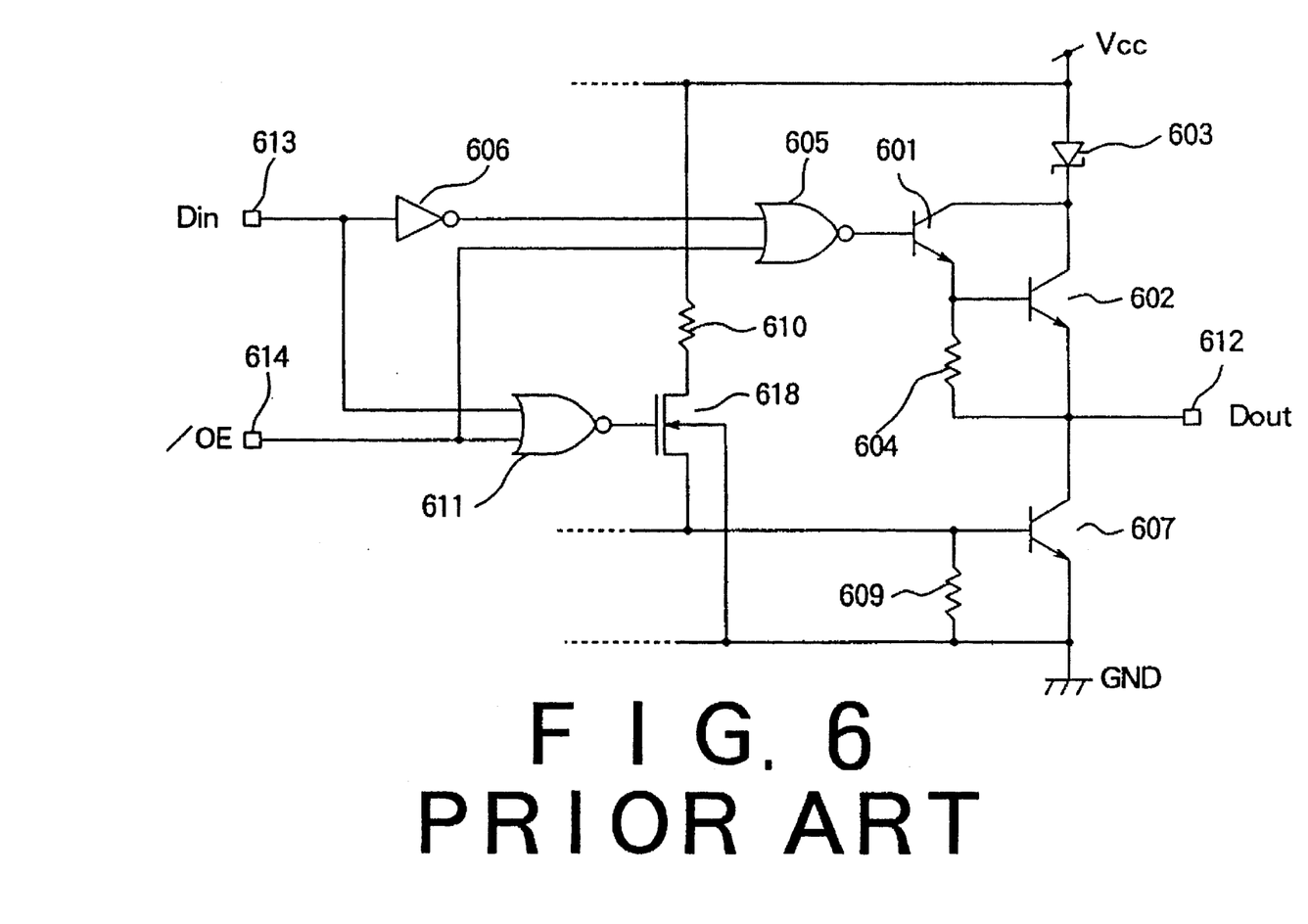
FIG. 6 is a circuit diagram of a conventional output circuit.

A conventional output circuit is shown in FIG. 6. In FIG. 6, NPN bipolar transistors 601 and 602 are connected in a Darlington configuration. Also, a Schottky barrier diode 603 is connected in the forward direction between a power supply Vcc and the collectors of the transistors 601 and 602. The emitter of the transistor 601 is connected through a resistor 604 to the emitter of the transistor 602, and to an output terminal 612. The base of the transistor 601 is connected to the output terminal of a NOR circuit 605. One input terminal of the NOR circuit 605 is connected through a NOT circuit 606 to a signal input terminal 613, while the other input terminal is connected to a terminal 614 for an output enable signal.

The collector of an NPN bipolar transistor 607 is connected to the output terminal 612, the emitter is grounded, and the base is connected to the source of an NMOS transistor 618. A resistor 609 is disposed between the base of the transistor 607 and ground GND. The drain of the NMOS transistor 618 is connected through a resistor 610 to the power supply Vcc, and the gate is connected to the output terminal of a NOR circuit 611. One input of the NOR circuit 611 is connected to the signal input terminal 613 and the other input is connected the output enable signal terminal 614.

In this output circuit, when the output enable signal /OE is low level and the input signal Din is high level, the NOR circuit 605 output is high level and the NOR circuit 611 output is low level. As a result, the transistor 601 is on and the transistor 602 is also on. Conversely, since the NMOS transistor 608 is off, the transistor 607 is also off. Consequently, the output signal Dout potential from the output terminal 612 is high level.

When the output enable signal /OE is high level and the input signal Din is also low level, the NOR circuit 605 output is low level and the NOR circuit 611 output is high level. The transistors 601, 602 and 607 are thus off, off and on, respectively. Consequently the output signal Dout potential is low level (zero volts).

Also, when the output enable signal /OE is high level, regardless of the input signal Din signal level, the outputs of the NOR circuits 605 and 611 are low level. The transistors 601, 602 and 607 are respectively off. As a result, the output signal Dout potential is undetermined.

Figure 7:
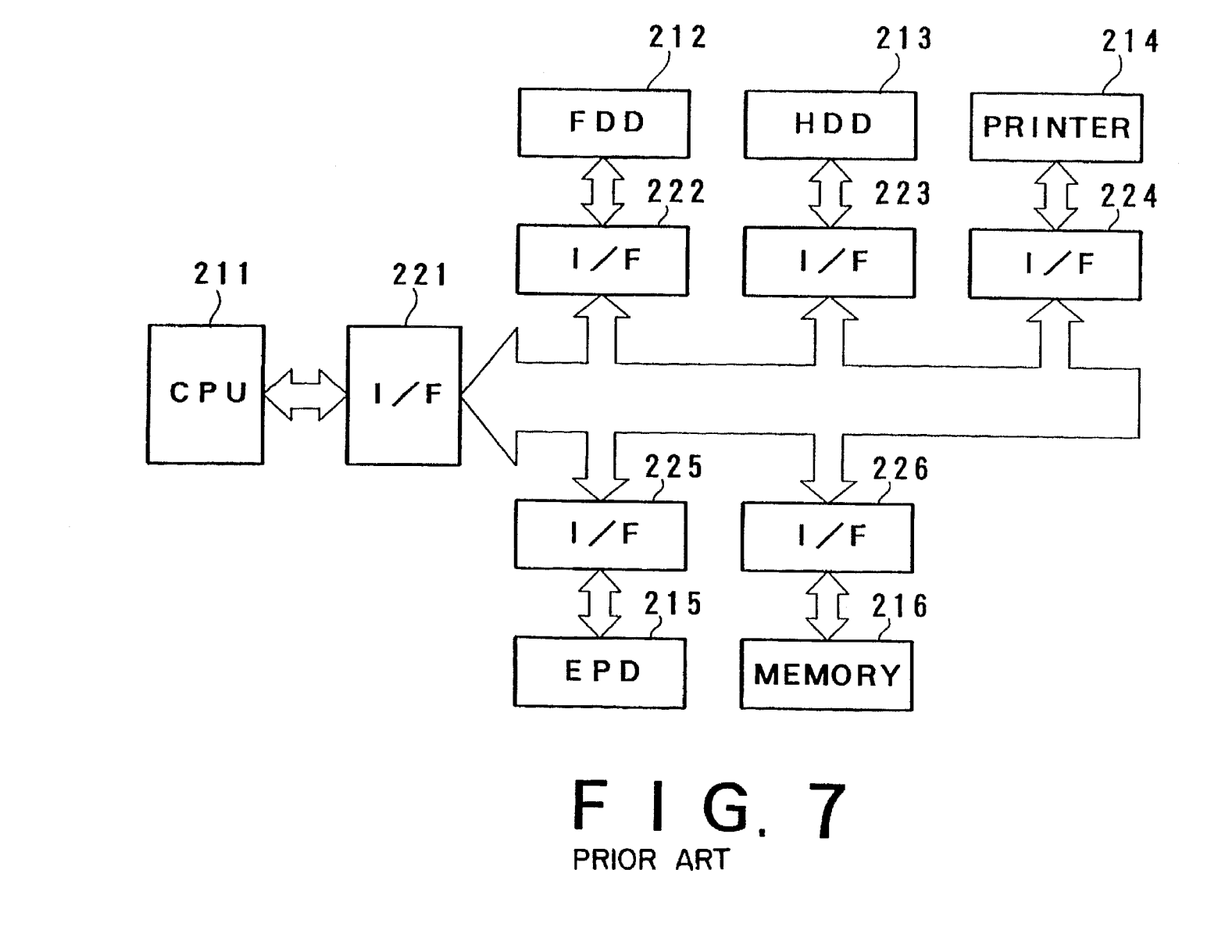
FIG. 7 is a block diagram showing an example using the output circuit of FIG. 6.

FIG. 7 is a block diagram for describing an example of using the output circuit shown in FIG. 6. As shown in FIG. 7, a CPU (central processing unit), floppy disk drive device 212, hard disk drive device 213, printer 214, flat panel drive device 215 and memory 216 are connected as terminal devices to a system bus 201 via interface boards 221 to 226. The output circuit indicated in FIG. 6 is disposed in the respective interface boards 221 to 226.

In a system such as shown in FIG. 7, normally only one port is operating, while the other ports are non-operating.

For example, while the port between the CPU 211 and floppy disk drive device 212 is operating, there are many cases where the ports between the CPU 221 and other terminals 223 to 226 are non-operating. In this case, although interface ports 221 and 222 are operating, the other interface boards 223–226 are disabled.

Also, in view of the strong trend in recent years to reduce power consumption, when the terminals 213 to 216 are non-operating, there are cases where the power is cut off from the interface boards 223–226 corresponding to these terminals. Consequently, each output circuit needs to be constructed so that the output signal Dout from the output circuits of the operating interface boards does not produce leak current in the output circuits of the disabled or unpowered interface boards. When this type of leak current is produced, the signal Dout potential declines and there is risk of faulty operation, while power consumption is increased.

Although the output signal Dout is typically supplied to 5 volt terminals at present, 3 volt terminal devices are expected to increase in the future, resulting in systems combining both 5 volt and 3 volt terminals. Consequently, even in the case of an interface board output circuit corresponding to a terminal wherein the output signal Dout is 3 volts, the off leak response needs to be maintained up to the area of 7 volts.

Figure 8:
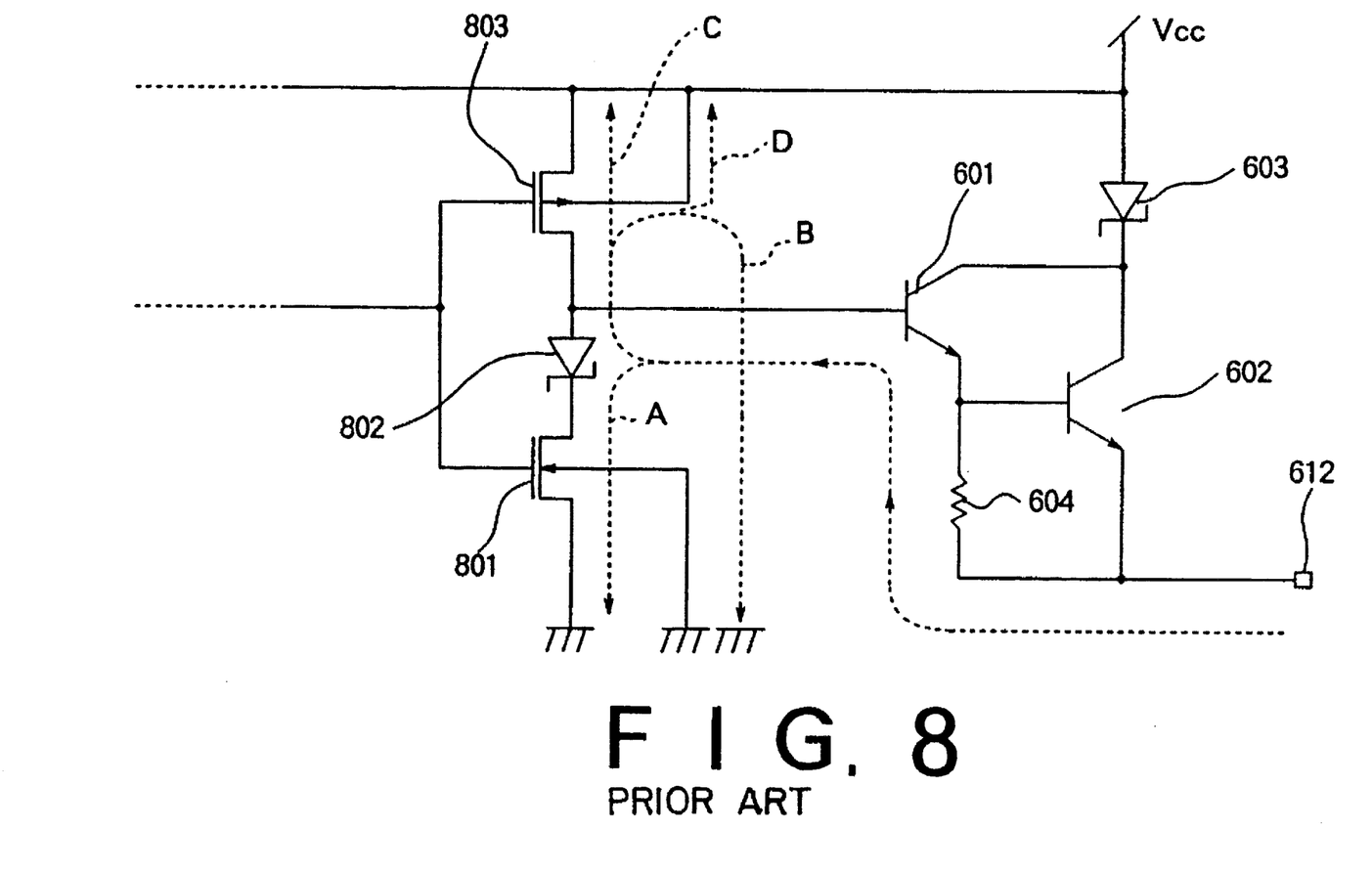
FIG. 8 is a schematic diagram for describing the current leak routes of the output circuit of FIG. 6.

FIG. 8 is a schematic diagram for describing the leak current generating process. In FIG. 8, the same symbols are used to designate the same components respectively indicated in FIG. 6. Also, the NOT circuit having MOS transistors 801 and 803, and Schottky barrier diode 802 comprises the output portion of the NOR circuit 605 of FIG. 6.

In FIG. 8, route A indicates leakage of current supplied from the output terminal 612 through the resistor 604 to the bipolar transistor 601 emitter to the base side, and flows to ground GND via Schottky barrier diode 802 and NMOS transistor 801. The route A leakage normally occurs in an output circuit where the sum of the transistor 601 emitter back withstand voltage and diode 802 rise voltage Vf is smaller than the voltage Vout, thereby producing the disabled state where the NMOS transistor 801 switches on.

In this specification, the term "emitter back withstand voltage" means a threshold voltage at which a current leaks from the emitter to base of a bipolar transistor.

Route B indicates leakage of current supplied from the output terminal 612 through the resistor 604 to the emitter of transistor 601 to the base side, which additionally leaks from the PMOS transistor 803 drain to the semiconductor substrate and flows to ground GND. The route B leakage normally occurs in an output circuit where the sum of the transistor 601 emitter back withstand voltage and the PMOS transistor 803 drain to substrate lateral withstand voltage is smaller than the voltage Vout, thereby cutting off the power supply.

Route C indicates leakage of current supplied from the output terminal 612 through the resistor 604 to the emitter of the transistor 601 to the base side, which additionally leaks from the PMOS transistor 803 drain to the source and flows to the power supply line. The route C leakage normally occurs in an output circuit where the sum of the transistor 601 emitter back withstand voltage and the PMOS transistor 803 threshold voltage Vth and the transistor 803 back gate effect is less than voltage Vout, thereby shifting the power supply state to off (i.e., Vcc=0).

Route D indicates leakage of current supplied from the output terminal 612 through the resistor 604 to the emitter of transistor 601 to the base side, which additionally leaks from the PMOS transistor 803 drain via substrate to the power supply Vcc. The route D leakage normally occurs in an output circuit where the sum of the transistor 601 emitter back withstand voltage and the PMOS transistor 803 drain to substrate lateral withstand voltage is smaller than the voltage Vout, thereby shifting the power supply state to off (i.e., Vcc=0).

In order to improve the output circuit off leak characteristics, improving the withstand voltage of the output circuit having elements, such as 601 and 803, can be considered. However, improving the off leak characteristics of an output circuit such as shown in FIG. 6 to approximately 7 volts is impossible. When attempting to improve these characteristics for the bipolar and MOS transistors, the characteristics of other transistors and the output circuit are impaired. For example, when the bipolar transistors emitter back withstand voltage is raised, the current amplification factor Hfe declines. And, when the MOS transistor junction withstand voltage and threshold voltage Vth are raised, the mutual conductance Cm declines.

SUMMARY OF THE INVENTION

The present invention considers the above mentioned defects and provides an output circuit having improved off leak characteristics without loss of output response.

The present invention provides an output circuit comprising: a bipolar transistor circuit having at least a first and a second bipolar transistor connected in a Darlington configuration, a base of the first transistor being supplied with an input signal, a corrector of the second transistor being connected to a power supply through a first diode, and a signal being outputted from an emitter of the second transistor; and a first PMOS transistor having a source connected to a base of the second transistor, a drain being grounded, and a backgate connected to the power supply through the first diode.

The out circuit may further comprise a second PMOS transistor having a source and a backgate both connected to the power supply, a drain connected to the base of the second transistor through a second diode, and a gate supplied with an inverting signal of the input signal.

The output circuit may further comprise: a second PMOS transistor connected between the drain of the first PMOS transistor and ground, having a source and a backgate both being grounded, a drain connected to the drain of the first PMOS transistor, and a gate supplied with the input signal; and a third bipolar transistor having a base connected to the drain of the first PMOS transistor, a corrector connected to the base of the second transistor, and an emitter being grounded.

Further, the present invention provides an output circuit comprising: a bipolar transistor circuit having at least a first and a second bipolar transistor connected in a Darlington configuration, a base of the first transistor being supplied with an input signal, a corrector of the second transistor being connected to a power supply through a first diode, and a signal being outputted from an emitter of the second transistor; a first PMOS transistor having a source and a backgate both connected to the power supply, a gate supplied with an inverting signal of the input signal; a first NMOS transistor having a source connected to a drain of the first PMOS transistor, a gate connected to a base of the second transistor, and a backgate being grounded; a second NMOS transistor having a source connected to a drain of the first NMOS transistor, a gate supplied with the inverting signal, and a drain and a backgate both being grounded; and a third bipolar transistor having a corrector connected to the base of the second transistor, a base connected to a drain of the first NMOS transistor, and an emitter being grounded.

Further, the present invention provides an output circuit comprising: a first PMOS transistor having a gate supplied with an input signal, a backgate connected to a power supply through a diode, and a drain being grounded; a bipolar transistor having a base connected to a source of the first PMOS transistor, and a corrector connected to the power supply through the diode, a signal being outputted from an emitter of the bipolar transistor; and a second PMOS transistor having a source and a backgate both connected to the power supply through the diode, a drain connected to the base of the bipolar transistor, and a gate supplied with an inverting signal of the input signal.

DETAILED DESCRIPTION OF THE PREFERRED EMBODIMENTS

Following is a description of the preferred embodiments of the present invention with reference to the attached drawings.

Figure 1:
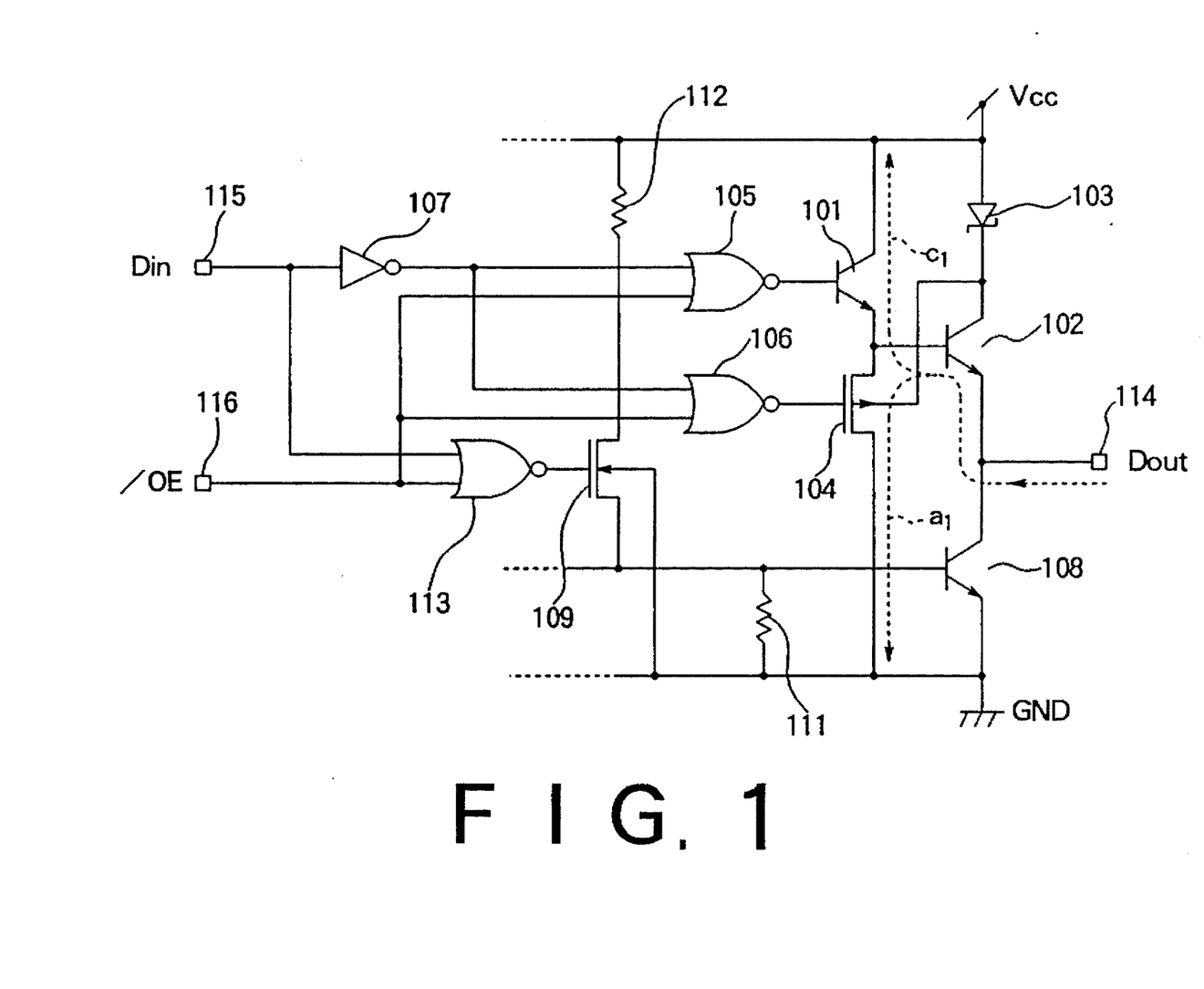
FIG. 1 is a circuit diagram of an output circuit of a first embodiment according to the present invention.

FIG. 1 is a circuit diagram of an output circuit of a first embodiment according to the invention.

In FIG. 1, bipolar transistors 101 and 102 comprise a Darlington connection circuit. The transistor 101 base is connected to a NOR circuit 105 output terminal, while the collector is connected to a power supply Vcc. The transistor 102 base is connected to the emitter of the transistor 101, the collector is connected through a Schottky barrier diode 103 to the power supply Vcc, and the emitter is connected to an output terminal 114. The source of a PMOS transistor 104 is connected to the base of the transistor 102, the drain is grounded, the gate is connected to the output of a NOR circuit 106, and the back gate is connected through the diode 103 to the power supply Vcc.

One input terminal of each of the NOR circuits 105 and 106 is connected through a NOT circuit 107 to an input terminal 115, while the other of the respective input terminals is connected to an output enable signal terminal 116. The collector of an NPN bipolar transistor 108 is connected to the output terminal 114, the emitter is grounded, and the base is connected to the source of an NMOS transistor 109. A resistor 111 is disposed between the base and ground GND of the transistor 108. The NMOS transistor 109 drain is connected through a resistor 112 to the power supply Vcc, and the gate is connected to the output terminal of a NOR circuit 113. One input of the NOR circuit 113 is connected to the signal input terminal 115 and the other input terminal is connected to the output enable signal terminal 116.

In this output circuit, when the output enable signal /OE is low level and the input signal Din is high level, high level appears at the NOR circuits 105 and 106 outputs and the NOR circuit 113 output goes to low level (thus, the transistor 101 input signal is almost the same as Din). As a result, the transistor 101 is on, and since the NOR circuit 106 output goes to high level, the MOS transistor 104 is off. Therefore, the transistor 102 switches on. Conversely, since the NMOS transistor 109 is off, the transistor 108 is off. As a result, the output signal Dout potential from the output terminal 114 is high level.

When both the output enable signal /OE and input signal Din are low level, the NOR circuit 105 and 106 outputs are low level and the NOR circuit 113 output is high level. The transistors 101, 104 and 109 are thus off, on, on, respectively. As a result, the transistor 102 is off and the transistor 108 is on. Thus, the signal Dout potential goes to low level.

When the output enable signal /OE is high level, regardless of the input signal Din level, the NOR circuit 105, 106 and 113 outputs go to low level. The transistors 101 and 109 are thus off, and the transistor 104 is on. Consequently, the transistors 102 and 108 are respectively off, and the signal Dout potential is undetermined.

Following is a description of the off leak characteristics of the output circuit of the first embodiment.

In the disabled state, current supplied from the output terminal 114 of FIG. 1 to the transistor 102 emitter leaks to the base side and flows via PMOS transistor 104 to the ground GND (route a1 in FIG. 1). In the output circuit, the off leak characteristics with respect to the route a1 leakage can be considered to be the sum of the bipolar transistor 102 emitter back withstand voltage, the MOS transistor 104 threshold voltage and voltage from the MOS transistor 104 back gate bias effect. As a result, without changing the withstand voltage of each element, the present embodiment easily enables the withstand voltage improvement of 2 to 3 volts compared to the conventional voltage output circuit (see route A of FIG. 8).

In the power supply off state, the transistors 101 and 102 are present in the current leakage route (route c1) from the output terminal 114 to the power supply Vcc. Twice the withstand voltage of the bipolar transistor emitter back withstand voltage thus can be obtained. And, as a result, the risk of leak is extremely small compared to the conventional output circuit (see route C of FIG. 8).

As described above, according to the output circuit of the first embodiment, the overall withstand voltage of the output circuit can be improved without increasing the withstand voltage of each element. The off leak characteristics thus can be improved without loss of output response.

Figure 2:
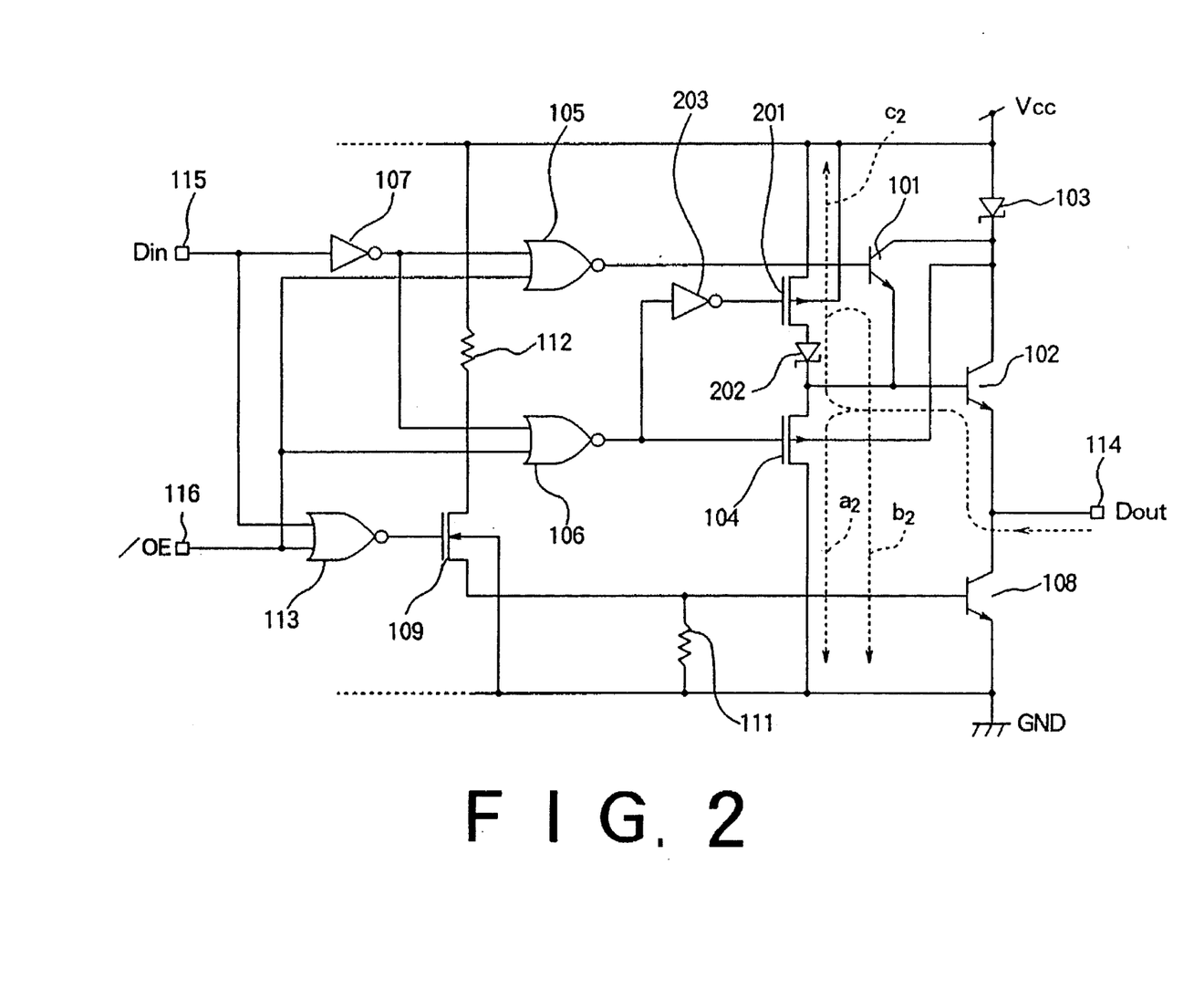
FIG. 2 is a circuit diagram of an output circuit of a second embodiment according to the present invention.

FIG. 2 is a circuit diagram of an output circuit of a second embodiment according to the invention.

In FIG. 2 as well, bipolar transistors 101 and 102 comprise a Darlington connection circuit. The transistor 101 base is connected to the output terminal of a NOR circuit, while the collector is connected through a Schottky barrier diode 103 to the power supply Vcc. Also, the transistor 102 base is connected to the transistor 101 emitter, the collector is connected through the diode 103 to the power supply Vcc, and the emitter is connected to the output terminal 114.

The same as the first embodiment, a PMOS transistor 104 source is connected to the transistor 102 base, the drain is grounded, the gate is connected to a NOR circuit 106 output terminal, and the back gate is connected through the 103 to the power supply Vcc.

The source of a PMOS transistor 201 is connected to the power supply Vcc, the drain is connected through a Schottky barrier 202 to the base of the transistor 102, the gate is connected through a NOT circuit 203 to the NOR circuit 106 output terminal, and the back gate is connected to the power supply Vcc.

Other aspects of the construction are the same as the first embodiment and their description is omitted below.

In this output circuit, when the output enable signal /OE is low level and the input signal Din is high level, the respective outputs of the NOR circuits 105 and 113 are high and low level. As a result, the transistor 101 switches on. Since the NOR circuit 106 output is high level, the MOS transistors 104 and 201 are respectively off and on. As a result, the transistor 102 switches on. Also, since the NMOS transistor 109 is off, the transistor 108 is also off. Consequently, the output signal Dout potential from the output terminal 114 is high level.

When both the output enable signal /OE and input signal Din are low level, the NOR circuit 105 output is low level and the NOR circuit 113 output is high level. The transistors 101 and 109 are thus off and on, respectively. Also, since the NOR circuit 106 output is low level, the MOS transistors 104 and 201 are respectively on and off. Consequently, bipolar transistors 102 and 108 are respectively off and on, and the signal Dout potential is low level.

When the output enable signal /OE is high level, regardless of the input signal Din level, the NOR circuit 105, 106 and 113 outputs are low level and transistors 101, 201 and 108 are off, while the transistor 104 is on. Consequently, the transistors 102 and 108 are off, and the signal Dout potential is undetermined.

The off leak characteristics of this circuit are described as follows.

In the disabled state, current leak occurs in route a2 of FIG. 2 (i.e., current supplied from the output terminal 114 to the transistor 102 emitter leaks to the base side, and flows to ground GND through the PMOS transistor 104). The same as the first embodiment, in this embodiment as well, the off leak characteristics with respect to the route a2 correspond to the sum of the transistor 102 emitter back withstand voltage, the MOS transistor 105 threshold voltage, and the MOS transistor 105 back gate bias effect voltage. As a result, without changing the withstand voltage of each element, the present embodiment easily enables a withstand voltage improvement of 2 to 3 volts compared to the conventional output circuit (see the route A of FIG. 8).

In the power supply off state, the off leak characteristics with respect to leakage occurring in routes b2 and c2 are improved to the extent of the diode 202 zener voltage. The route b2 is leak of current supplied from the output terminal 114 to the transistor 102 emitter to the base side, then through the diode 202 from the PMOS transistor 201 drain to the semiconductor substrate and flowing to ground GND. And, the route c2 is leak of current supplied from the output terminal 114 to the transistor 102 emitter to the base side, then through the diode 202 from the PMOS transistor 201 drain to the source and flowing to the power supply Vcc. Consequently, the withstand voltage can be improved in comparison to the conventional output circuit (see FIG. 8 routes B and C).

As described above, as a result of the output circuit of this embodiment, the overall withstand voltage of the output circuit can be improved without increasing the withstand voltage of each element. The off leak characteristics thus can be improved without loss of output response.

Also, in the case of a Darlington connected output circuit, the output potential Dout high level voltage is Vcc−2Vbe.

However, in the case of this embodiment, bipolar transistor 102 is directly driven by the MOS transistors 104 and 105. Thus, even when the power supply potential Vcc declines, reduction of the output potential Dout can be strongly suppressed.

Figure 3:
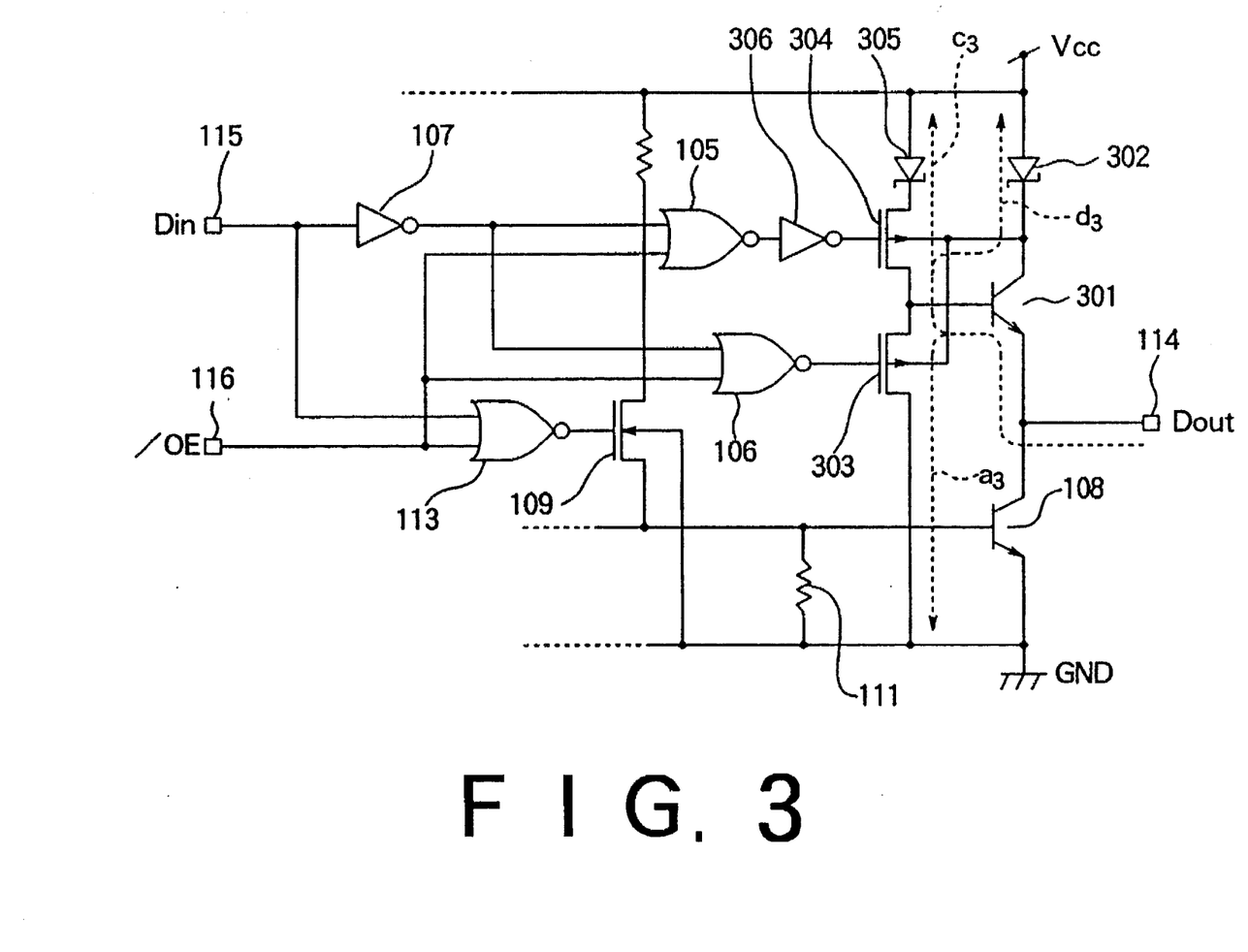
FIG. 3 is a circuit diagram of an output circuit of a third embodiment according to the present invention.

FIG. 3 is a circuit diagram of an output circuit of a third embodiment according to the invention. In FIG. 3, the same symbols are used to designate the same components respectively indicated in FIG. 1.

The collector of a bipolar transistor 301 is connected through a Schottky barrier diode 302 to a power supply Vcc and the emitter is connected to an output terminal 114.

The source of a PMOS transistor 303 is connected to the transistor 301 base, the drain is grounded, the gate is connected to a NOR circuit 106 output terminal, and the back gate is connected through the diode 302 to the power supply Vcc.

The source of a PMOS transistor 304 is connected through a Schottky barrier diode 305 to the power supply Vcc, the drain is connected to the transistor 301 base, the gate is connected through a NOT circuit 306 to a NOR circuit 105 output terminal, and the back gate is connected through the diode 302 to the power supply Vcc.

In this output circuit, when the output enable signal /OE is low level and the input signal Din is high level, the NOR circuit 105 and 106 outputs are high level (thus, the PMOS transistor 303 input signal is almost the same as Din, while the PMOS transistor 304 input signal is substantially the inverse of Din), and the NOR circuit 113 output is low level. As a result, since the PMOS transistor 303 is off and the PMOS transistor 304 on, the transistor 301 is also on. Conversely, since the NMOS transistor 109 is off, the transistor 108 is also off. Consequently, the output signal Dout potential from output terminal 114 is high level.

When both the output enable signal /OE and input signal Din are low level, since the NOR circuit 105 and 106 outputs are low level (thus, the PMOS transistor 303 input signal is almost the same as Din, while the PMOS transistor 304 input signal is substantially the inverse of Din), the PMOS transistors 303 and 304 are on and off, respectively. The transistor 301 is thus off. Further, the NOR circuit 113 output is high level, the NMOS transistor 109 is on and the transistor 108 is on. Consequently, the signal Dout potential is low level.

When the output enable signal /OE is high level (disabled state), regardless of the input signal Din level, the NOR circuit 105, 106 and 113 outputs are low level. Thus, the transistors 303, 304 and 109 are respectively on, off, off, the transistors 301 and 308 are off. And, the output signal Dout potential is undetermined.

Following is a description of the off leak characteristics of this output circuit.

In the disabled state, current leak occurs in route a3 of FIG. 3 (current supplied from the output terminal 114 to the transistor 301 emitter leaks to the base side and flows through the PMOS transistor 303 to ground GND). In this embodiment, the off leak characteristics with respect to the route a3 correspond to the sum of the transistor 301 emitter back withstand voltage, the MOS transistor 303 threshold voltage and back gate bias effect voltage. As a result, without changing the withstand voltage of each element, the present embodiment easily enables a withstand voltage improvement of 2 to 3 volts compared to the conventional output circuit (see route A of FIG. 8).

In the power supply off state, the off leak characteristics with respect to leakage occurring in routes c3 and d3 can be improved. The routes c3 is leak of current supplied from the output terminal 114 to the transistor 301 emitter to the base side, and from the PMOS transistor 304 drain to source, then through the diode 305 to ground GND. And, the route d3 is leak of current supplied from the output terminal 114 to the transistor 301 emitter to the base side, then from the PMOS transistor drain to the substrate and through the diode 302 to the power supply Vcc. In other words, in the output circuit of this embodiment, the off leak characteristics increase to the extent of the diode 305 or diode 302 zener voltage. Consequently, the withstand voltage can be improved in comparison to the conventional output circuit (see FIG. 8 routes B and C).

As described above, as a result of the output circuit of this embodiment, the overall withstand voltage of the output circuit can be improved without increasing the withstand voltage of each element. The off leak characteristics thus can be improved without loss of output response.

Also, the same as in the second embodiment, in the third embodiment, the transistor 102 is directly driven by the MOS transistors 104 and 105. Thus, even when the power supply potential Vcc declines, reduction of the output potential Dout can be strongly suppressed.

Figure 4:
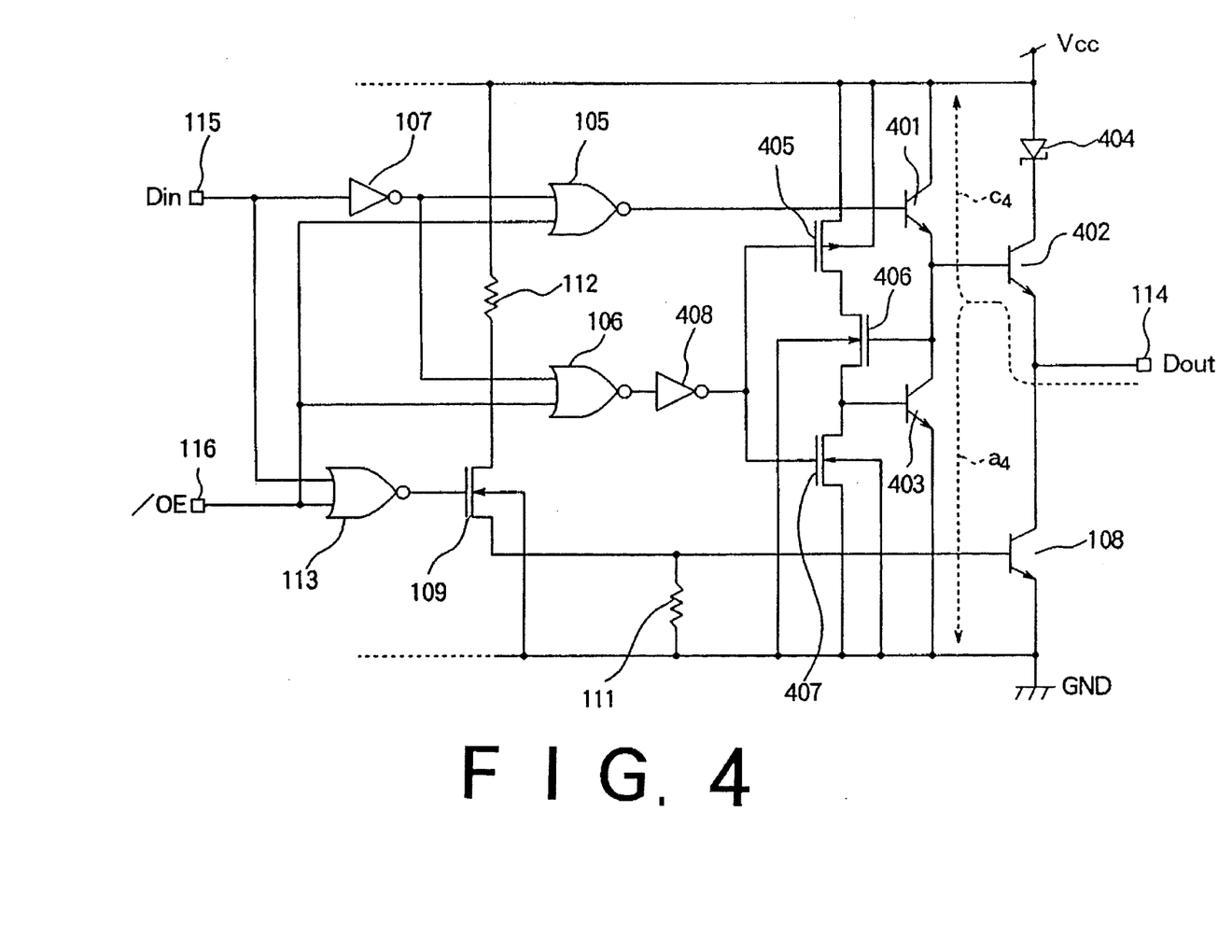
FIG. 4 is a circuit diagram of an output circuit of a fourth embodiment according to the present invention.

FIG. 4 is a circuit diagram of an output circuit of a forth embodiment according to the invention.

In FIG. 4, the same symbols are used to designate the same components respectively indicated in FIG. 1.

In FIG. 4, bipolar transistors 401 and 402 comprise a Darlington configuration. The transistor 401 base is connected to a NOR circuit 105 output terminal and the collector is connected to a power supply Vcc. The base of the transistor 402 is connected to the transistor 401 emitter, the collector is connected through a diode 404 to the power supply Vcc, and the emitter is connected to an output terminal 114. The collector of a bipolar transistor 403 is connected to the transistor 402 base and the emitter is grounded.

Also, a PMOS transistor 405 and NMOS transistors 406 and 407 are connected in series between the power supply Vcc and ground GND.

The bases of the MOS transistors 405 and 407 are connected to the output terminal of a NOT circuit 408, while the gate of the MOS transistor 406 is connected to the base of the transistor 402. The MOS transistor 405 back gate is connected to the power supply Vcc, and the back gates of the MOS transistors 406 and 407 are grounded.

In this output circuit, when the output enable signal /OE is low level and the input signal Din is high level, the NOR circuit 105 and 106 outputs are high level (thus, the transistor 401 input signal is almost the same as Din), and the NOR circuit 113 output is low level. As a result, since the transistor 401 is on, the transistor 402 is also on. Conversely, since the NMOS transistor 109 is off, the transistor 108 is also off. Consequently, the output signal Dout potential from output terminal 114 is high level. In this case, since the MOS transistors 405, 406 and 407 are respectively on, off, off, the transistor 403 is on.

When both the output enable signal /OE and input signal Din are low level, since the NOR circuit 105 and 106 outputs are low level (thus, the transistor 401 input signal is almost the same as Din), the transistor 401 is off, while the MOS transistors 405, 406 and 407 are respectively off, off, on. Consequently, the transistor 402 is off. Also, since the NOR circuit 113 output is high level, the NMOS transistor 109 is on and the transistor 108 is on. As a result, the output signal Dout is low level.

When the output enable signal /OE is high level (disabled state), regardless of the input signal Din level, the NOR circuit 105, 106 and 113 outputs are low level. As a result, the transistors 401 and 109 are off. Also, since the MOS transistors 405, 406 and 407 are respectively off, on, on, the transistor 403 is on. Consequently, the transistors 402 and 108 are off, and the output signal Dout potential is undetermined.

Following is a description of the off leak characteristics of this output circuit.

In the disabled state, current leak occurs in route a4 of FIG. 4 (current supplied from the output terminal 114 flows to ground GND through the transistors 402 and 403). In this embodiment, by providing the transistors 402 and 403, twice the withstand voltage of a bipolar transistor emitter back withstand voltage can be obtained. And, as a result, the risk of leak is extremely small compared to the conventional output circuit (see route A of FIG. 8).

In the power supply off state, the off leak characteristics with respect to leakage occurring in route a4 (leak of current supplied from the output terminal 114 to the transistors 402 and 403 to ground GND) can be improved. Also in this embodiment, by providing the transistors 402 and 403, twice the withstand voltage of a bipolar transistor emitter back withstand voltage can be obtained. And, as a result, the risk of leak is extremely small compared to the conventional output circuit (see route C of FIG. 8).

As described above, as a result of the output circuit of this embodiment, the overall withstand voltage of the output circuit can be improved without increasing the withstand voltage of each element. The off leak characteristics thus can be improved without loss of output response.

Figure 5:
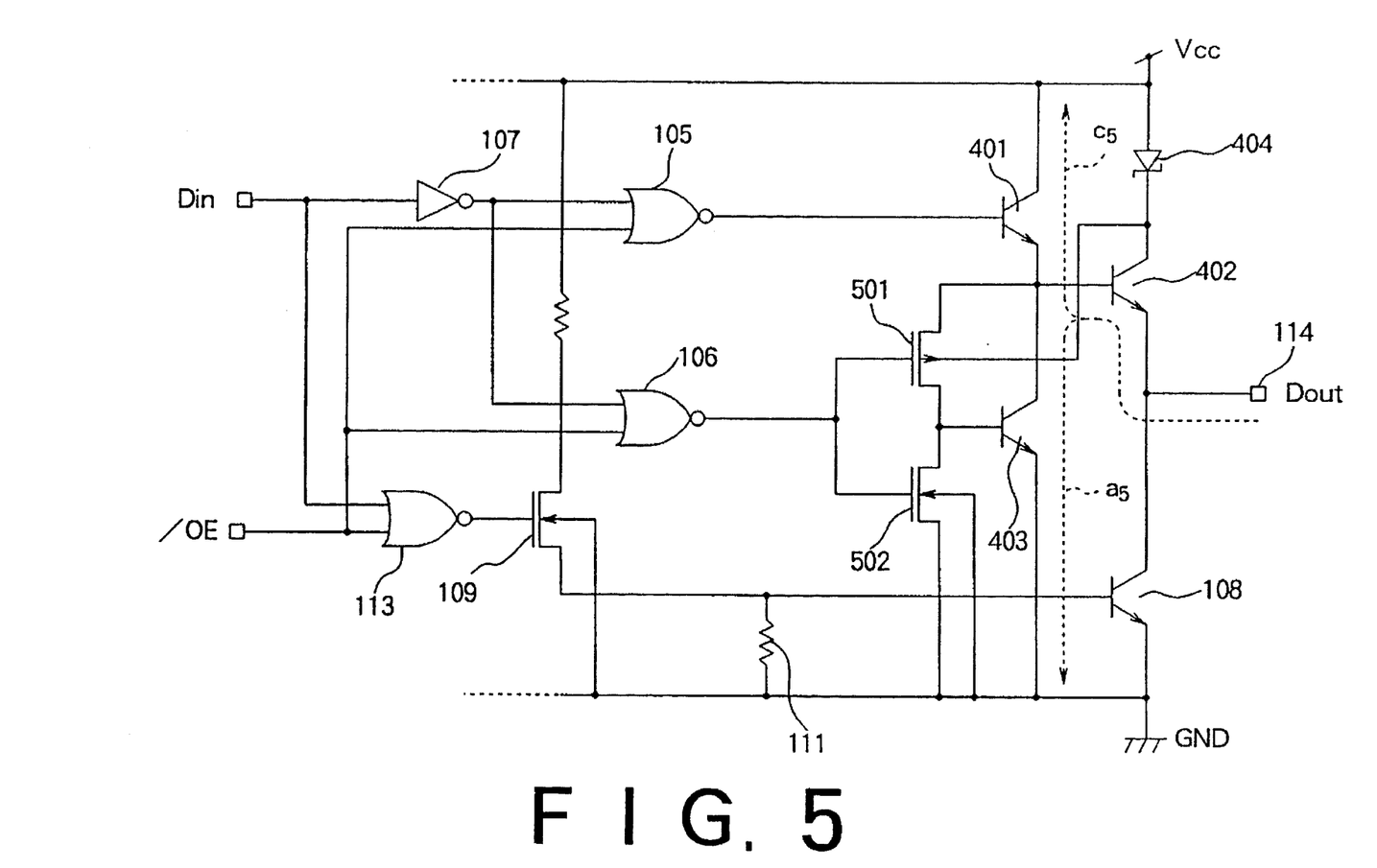
FIG. 5 is a circuit diagram of an output circuit of a fifth embodiment according to the present invention.

FIG. 5 is a circuit diagram of an output circuit of a fifth embodiment according to the invention. In FIG. 4, the same symbols are used to designate the same components respectively indicated in FIGS. 1 and 4.

In FIG. 5, the source of a PMOS transistor 501 is connected to a bipolar transistor 404 base, the drain is connected to a bipolar transistor 403 base, the gate is connected to a NOR circuit 106 output terminal, and the back gate is connected through a Schottky barrier diode 404 to a power supply Vcc.

Also, the source and back pate of an NMOS transistor 502 are grounded, the drain is connected to the transistor 403 base, and the gate is connected to the NOR circuit 106 output terminal.

In this type output circuit, when the output enable signal /OE is low level and the input signal Din is high level, the NOR circuit 105 and 106 outputs are high level and the NOR transistor 113 output is low level. As a result, a bipolar transistor 401 is on and the MOS transistors 501 and 502 are respectively off and on. And, since the transistor 403 is off, the transistor 402 is on. Also, since an NMOS transistor 109 is off, a bipolar transistor 108 is off. Consequently, the output signal Dout potential from the output terminal 114 is high level.

When both the output enable signal /OE and input signal Din are low level, the NOR circuit 105 and 106 outputs are low level. Thus, the transistor 401 is off, the transistor 402 is off. Also, since the NOR circuit 113 output is high level, the NMOS transistor 109 is on and the transistor 108 is on. As a result, the output signal Dout potential is low level.

When the output enable signal /OE is high level (disabled state), regardless of the input signal Din level, the NOR circuit 105, 106 and 113 outputs are low level. As a result, the transistors 401 and 109 are off. Consequently, the transistors 402 and 108 are off, and the output signal Dout potential is undetermined.

Following is a description of the off leak characteristics of this output circuit.

In the disabled state, although current leak occurs in route a5 of FIG. 5 (from the output terminal 114 through the transistors 402 and 403 to ground), by providing bipolar transistors 402 and 403, twice the withstand voltage of a bipolar transistor emitter back withstand voltage can be obtained. The risk of leak is thus extremely small compared to the conventional output circuit (see route A of FIG. 8).

Also, in the power off state, although current leak occurs in route c5 (from the output terminal 114 through the transistors 402 and 401 to ground), by providing the transistors 402 and 401, twice the withstand voltage of bipolar transistor emitter back withstand voltage can be obtained. The risk of leak is thus extremely small compared to the conventional output circuit (see route C of FIG. 8).

As described above, as a result of the output circuit of this embodiment as well, the overall withstand voltage output circuit can be improved without increasing the withstand voltage of each element. The off leak characteristics thus can be improved without loss of output response.

As described in the foregoing, the present invention provides output circuits wherein the overall withstand voltage of the output circuits can be improved without increasing the withstand voltage of each element and the off leak characteristics can be improved without loss of output response.

What is claimed is:

1. An output circuit comprising:

a bipolar transistor circuit having at least a first and a second bipolar transistor connected in a Darlington configuration, a base of the first transistor being supplied with an input signal, a collector of the second transistor being connected to a power supply through a first diode, and a signal being outputted from an emitter of the second transistor; and a first PMOS transistor having a source connected to a base of the second transistor, a drain being grounded, and a backgate connected to the power supply through the first diode.

2. The output circuit according to claim 1, further comprising a second PMOS transistor having a source and a backgate both connected to the power supply, a drain connected to the base of the second transistor through a second diode, and a gate supplied with an inverting signal of the input signal.

3. The output circuit according to claim 1, further comprising:

a second PMOS transistor connected between the drain of the first PMOS transistor and ground, having a source and a backgate both being grounded, a drain connected to the drain of the first PMOS transistor, and a gate supplied with the input signal; and a third bipolar transistor having a base connected to the drain of the first PMOS transistor, a collector connected to the base of the second transistor, and an emitter being grounded.

4. An output circuit comprising:

a bipolar transistor circuit having at least a first and a second bipolar transistor connected in Darlington configuration, a base of the first transistor being supplied with an input signal, a collector of the second transistor being connected to a power supply through a first diode, and a signal being outputted from an emitter of the second transistor;

a first PMOS transistor having a source and a backgate both connected to the power supply, a gate supplied with an inverting signal of the input signal;

a first NMOS transistor having a source connected to a drain of the first PMOS transistor, a gate connected to a base of the second transistor, and a backgate being grounded;

a second NMOS transistor having a source connected to a drain of the first NMOS transistor, a gate supplied with the inverting signal, and a drain and a backgate both a third bipolar transistor having a collector connected to the base of the second transistor, a base connected to a drain of the first NMOS transistor, and an emitter being grounded.

5. An output circuit comprising:

a first PMOS transistor having a gate supplied with an input signal, a backgate connected to a power supply through a diode, and a drain being grounded;

a bipolar transistor having a base connected to source of the first PMOS transistor, and a collector connected to the power supply through the diode, a signal being outputted from an emitter of the bipolar transistor; and a second PMOS transistor having a source and a backgate both connected to the power supply through the diode, a drain connected to the base of the bipolar transistor, and a gate supplied with an inverting signal of the input signal.

* * * * *